United States Patent
Nix et al.

(10) Patent No.: US 6,677,879 B1
(45) Date of Patent: Jan. 13, 2004

(54) METHOD AND CIRCUIT FOR FOLDED ANALOG-TO-DIGITAL CONVERTER (ADC) USING FREQUENCY DETECTORS AND TIME DETECTORS

(75) Inventors: Michael A. Nix, Buda, TX (US); Ahmed Younis, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/224,976

(22) Filed: Aug. 20, 2002

(51) Int. Cl.[7] .............................. H03M 1/12; H03M 1/38
(52) U.S. Cl. ......................................... 341/161; 341/156
(58) Field of Search ................................... 341/161, 143, 341/157, 156; 327/553, 115, 175; 375/376, 346, 364; 331/1 A; 348/536, 555, 725, 726, 497; 714/781; 340/146.2; 342/352

(56) References Cited

U.S. PATENT DOCUMENTS 6,141,394 A * 10/2000 Linebarger et al. ......... 375/376
6,356,129 B1 * 3/2002 O'Brien et al. ............. 327/175
6,512,414 B2 * 1/2003 Yokoyama et al. ......... 327/553

OTHER PUBLICATIONS

U.S. patent application Ser. No. 10/224,978, Younis et al., filed Aug. 8, 2002.

* cited by examiner

*Primary Examiner*—Patrick Wamsley
(74) *Attorney, Agent, or Firm*—Pablo Meles

(57) ABSTRACT

A voltage of an input analog signal (105 or 405) can be converted to a signal whose frequency is dependent upon the analog input signal (135 or 435). A frequency divider (115 or 415) can be configured to convert the frequency dependent signal to a frequency divided signal (140 or 440). A first frequency detector (420*a*) or time detector (120*a*) can be configured to determine the frequency of the frequency divided signal, thereby creating a first output signal (145*a* or 445*a*). A second frequency detector (420*b*) or time detector (120*b*) can be configured to determine the frequency of the frequency dependent or non-frequency divided signal, thereby creating a second output signal (145*b* or 445*b*). The first and second output signals can be post-processed to generate a digital output signal (130 or 430) that is representative of the input analog signal.

17 Claims, 7 Drawing Sheets

METHOD AND CIRCUIT FOR FOLDED ANALOG-TO-DIGITAL CONVERTER (ADC) USING FREQUENCY DETECTORS AND TIME DETECTORS

FIELD OF THE INVENTION

This invention relates generally to signal processing, and more particularly to a method and circuit for implementing an analog-to-digital converter (ADC) using folding frequency detector circuits or folding time detector circuits.

BACKGROUND OF THE INVENTION

An analog-to-digital converter (ADC) converts an input analog signal to an output digital signal that is an approximation of the input analog signal. The resolution of an ADC defines the accuracy of the approximation between the output digital signal and the input analog signal. In this regard, the closer the resemblance between the output digital signal and the input analog signal, the greater the resolution of the ADC. ADCs having various architectures are well known in the art. In general, each ADC architecture can have specific characteristics making it suitable or unsuitable for a particular application.

One of the most popular ADC architectures is a pipeline ADC. Pipeline ADCs generally find application in systems operating at speeds of 10–200 MHz and requiring moderate resolution of the order of 10–14 bits. Their power consumption can be classified as being moderate when compared to other types of ADCS. The popularity of pipeline ADCs can be attributed to factors such as their resolution, speed, size and power consumption. A typical architecture of a pipeline ADC can include a plurality of consecutively coupled processing stages that can include a track-and-hold (T/H) circuit, and a summation circuit and amplification circuit coupled to each stage. A major drawback with pipeline ADCs involves latency occurring at various processing stages. For this and other reasons, pipeline ADCs are extremely sensitive to non-linearities affecting offset and gain. ADC based designs typically require complex reference circuitry and precise latch timing in order to ensure output synchronization.

Another popular ADC architecture is the sigma-delta ADC. The sigma-delta ADC typically finds application in systems operating at speeds of about 20 MHz and requiring high resolution of the order of 12–16 bits. A typical sigma-delta ADC can include a comparator and an integrator having a feedback loop containing a 1-bit DAC. In this regard, sigma-delta ADCs can be cheaply produced and can save on expensive printed circuit board (PCB) real estate. Notwithstanding, although sigma-delta ADCs can provide a higher resolution than pipeline ADCs, their application is limited by their speed.

The flash ADC is also a very popular and well known ADC architecture. Although flash ADCs can operate at speeds in excess of 1 GHz, power consumption is extremely high. Furthermore, their cost can be very high when compared to other ADCs.

Although not as fast as flash ADCs, folded ADCs can provide greater design and operating flexibility than flash ADCs. Folded ADCs are well known in the art and operate by folding the analog input voltage to create a repetitive output that varies over a particular input voltage range. Notwithstanding the fact that folded ADCs provide greater design flexibility than flash ADCs, current flash ADCs typically require a quadrupled number of components in order to achieve an increase resolution of two (2) bits.

Given these inflexibilities and other inherent drawbacks of existing ADCs including folded ADCs, there is a need for a method and circuit for providing a more flexible ADC with regard to resolution, power consumption, operating speed and cost.

SUMMARY OF THE INVENTION

The invention provides a method and system for converting an analog input signal to a digital output signal. The method can include the step of converting the analog input signal to at least one intermediate signal having a frequency dependent on the analog input signal. A frequency of the intermediate signal can be divided in order to generate a frequency divided signal. The frequency of the intermediate signal and frequency divided signal can subsequently be determined to provide a determined frequency signal or signals. The determined frequency signal (or signals) of the intermediate signal and the frequency divided signal can be processed in order to generate the digital output signal, which is representative of the analog input signal.

The converting step can further include the step of converting a voltage of the analog input signal to the intermediate frequency dependent signal. The frequency of the intermediate signal can be determined using a first time detector, while the frequency of the frequency divided signal can be determined using a second time detector. Alternatively, the frequency of the intermediate signal can be determined using a first frequency detector, while the frequency of the frequency divided signal can be determined using a second frequency detector.

The processing step can further include the steps of summing component signals of the intermediate signal and summing component signals of the frequency divided signal. The summed components of the intermediate signal and the frequency divided signal can subsequently be combined to generate a combined signal. The combined signal can be the digital output signal that is representative of the analog input signal. Optionally, the processing step can further include weighting the combined signal to generate the digital output signal that can be representative of the analog input signal.

The invention also provides analog-to-digital converter for converting an analog input signal to a digital output signal. The analog-to-digital converter can include means for converting the analog input signal to at least one intermediate signal having a frequency dependent on the analog input signal. Dividing means can be configured to divide a frequency of the intermediate signal to generate a frequency divided signal. Determining means can be configured to determine the frequency of the intermediate signal and the frequency divided signal. Processing means can be configured to process the determined frequency signal of the intermediate signal and the determined frequency signal of the frequency divided signal. The processing means can subsequently generate a digital output signal, which can be representative of the analog input signal.

The converting means of the analog-to-digital converter can further include means for converting a voltage of the analog input signal to the intermediate frequency dependent signal. The determining means can further include means for determining the frequency of the intermediate signal using a first time detector and means for determining the frequency of the frequency divided signal using a second time detector. Alternatively, the determining means can include a first frequency detector and a second frequency detector for determining the frequency of the intermediate signal and the frequency divided signal respectively.

The processing means of the analog-to-digital converter can further include means for summing component signals of the intermediate signal and means for summing component signals of the frequency divided signal. Combining means can be configured to combine the summed components of the intermediate signal and frequency divided signal to generate a combined signal. In this regard the combined signal can be the digital output signal, which is representative of the analog input signal. optionally, the analog-to-digital converter can further include means for weighting the combined signal to generate the digital output signal, which is representative of the analog input signal.

In another aspect of the invention, an analog-to-digital converter for converting an analog input signal to a digital output signal is provided. The analog-to-digital converter can include a voltage-to-frequency converter for converting the analog input signal to an intermediate signal having a frequency dependent on the analog input signal. A frequency divider can be configured to divide a frequency of the intermediate signal to generate a frequency divided signal. A first frequency detector can be configured to determine a frequency of the intermediate signal, while a second frequency detector can be configured to determine a frequency of the frequency divided signal. A post-processor can also be configured to process the determined frequency of the intermediate signal and the determined frequency of the frequency divided signal. The post-processor can subsequently generate a digital output signal, which is representative of the analog input signal.

The voltage-to-frequency converter of the analog-to-digital converter can be a voltage controlled oscillator, although the invention is not limited in this regard. The post-processor can include a first summer for summing component signals of the intermediate signal and a second summer for summing component signals of the frequency divided signal. A combiner can be configured for combining the summed components of the intermediate signal and the frequency divided signal to generate a combined signal. The combined signal can be the digital output signal, which is representative of the analog input signal. Optionally, the post-processor can further include a weighting function for weighting the combined signal to generate the digital output signal which is representative of the analog input signal.

In yet a further aspect of the invention, an analog-to-digital converter for converting an analog input signal to a digital output signal is provided. The analog-to-digital converter can include a voltage-to-frequency converter for converting the analog input signal to an intermediate signal having a frequency that is dependent on the analog input signal. A frequency divider can be configured to divide a frequency of the intermediate signal to generate a frequency divided signal. A first time detector can be configured to determine a frequency of the intermediate signal, while a second time detector can be configured to determine a frequency of the frequency divided signal. A post-processor can also be configured to process the determined frequency of the intermediate signal and determined frequency of the frequency divided signal. The post-processor can subsequently generate a digital output signal, which is representative of the analog input signal.

DETAILED DESCRIPTION OF THE DRAWINGS

Figure 1:
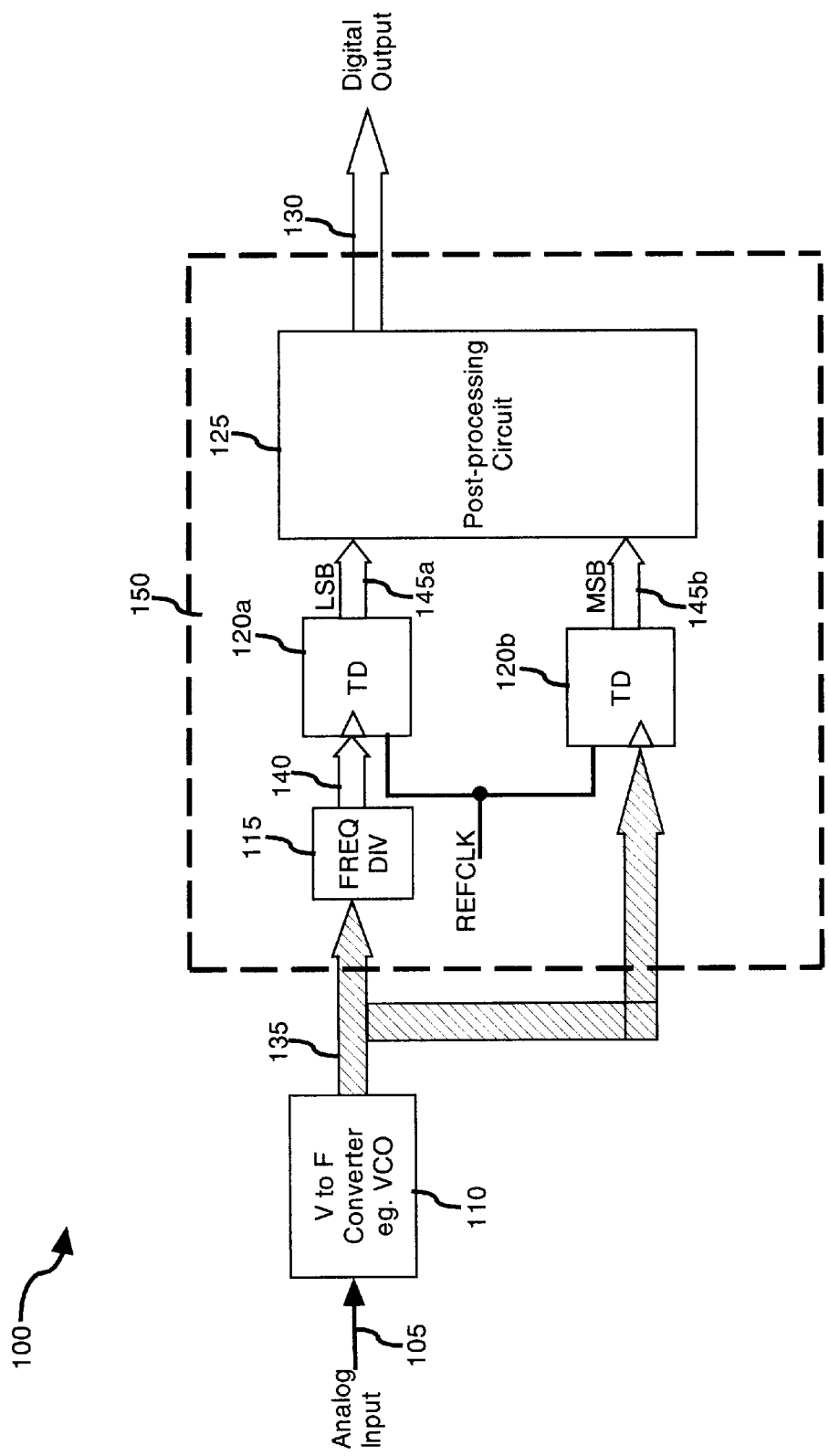
FIG. 1 is a block diagram of an exemplary folded analog-to-digital converter using time detectors in accordance with the inventive arrangements.

Referring to FIG. 1, there is shown a block diagram of an exemplary folded ADC 100 using time detectors in accordance with the inventive arrangements. The folded ADC 100 can include a voltage-to-frequency converter circuit 110, a frequency divider circuit 115, a first and a second time detector 120a, 120b, and a post-processing circuit 125. Importantly, although the frequency divider 115, time detectors 120a, 120b and post-processing circuit 125 are shown as separate components, any combination of these components can be embodied in a digital signal processor (DSP). For example, frequency divider 115, time detectors 120a, 120b and post-processing circuit 125 can be embodied in a DSP 150.

The voltage-to-frequency converter 110 can be any circuit that can convert an input such as analog input 105 to a signal whose frequency varies according to the voltage of the input signal. For example, the voltage-to-frequency converter 110 can be a voltage controlled oscillator (VCO), although the invention in not limited in this regard. Voltage-to-frequency converters including VCOs are well known in the art. In a case where frequency converter 110 is a VCO, VCO 110 can receive an analog input signal 105 and produce an output signal 135 whose frequency is dependent on the voltage of analog input signal 105. For example, the input analog signal 105 can be a sinusoidal signal. In this regard, the input analog signal 105 can function as a control voltage for the VCO 110. The VCO 110 can preferably be configured to generate one or more output signals 135 whose frequency can vary repetitively over a particular frequency range. The frequency of one or more output signals 135 can be proportional to the analog input. For example, as the magnitude of the input analog signal 105 increases, the frequency of the VCO output signal 135 can increase. Also, as the magnitude of the input analog signal 105 decreases, the frequency of the VCO output signal 135 can decrease.

In general, VCOs can be configured to generate a single output or multiple outputs having the same frequency. In a case where a VCO is configured to generate multiple outputs having the same frequency, although each of the outputs can have the same frequency, their phases can be shifted from each other by a constant value. Preferably, the phase shift can be equivalent to one period time divided by the number of outputs generated by the VCO. For example, where a VCO generates 20 outputs, each of the 20 outputs can be shifted in time by one period time divided by 20. This can be referred to as 10-stage VCO.

The output 135 of the voltage-to-frequency converter 110 can be coupled to a frequency divider circuit 115. Frequency divider circuits such as 115 are well known in the art. Frequency divider 115 can divide the frequency of an input signal such as 135. For example, if frequency divider 115 is configured as a divide-by-4 frequency divider circuit and the input signal 135 has a frequency f, then the output of frequency divider 115 can be f/4. A frequency divider can be implemented using one or more J–K flip-flops. The output of a first J–K flip-flop can be connected to the clock input of another J–K flip-flop to generate an output signal that is one-fourth a frequency of a signal applied to the first J–K flip-flop. This can create a divide-by-4 circuit. An output of the second J–K flip-flop can be connected to a clock input of a third J–K flip-flop to create a divide-by-8 circuit. In this regard, the output of the third J–K flip-flop can generate an output signal that is one-eighth the frequency of the signal applied to the first J–K flip-flop. The use of J–K flip-flops as frequency dividers is well known. However, the invention is not limited in this regard, and other circuits can be used to implement a frequency divider without departing from the inventive arrangements.

The output signal 140 of the frequency divider 115 can be coupled to a clock input of time detector 120a. In this regard, signal 135 can pass through a frequency divided path, which can include the frequency divider 115 and the time detector 120a. The output signal 145a of time detector 120a can be coupled to post-processing circuit 125. The output signal 145a can be used to represent the least significant bits. This can represent the least significant bit (LSB).

The output 135 of the voltage-to-frequency converter 110 can further be coupled to a clock input of time detector 120b. In this regard, signal 135 passes through a non-frequency divided path directly to the time detector 120b. The data inputs of time detectors 120a and 120b can be coupled to a reference clock signal REFCLK. The output signal 145b of time detector 120b can be coupled to post-processing circuit 125. In this regard, the output signal 145b can be used to represent the most significant bits (MSBs).

The post-processing circuit 125 can include one or more of a plurality of processing elements including summers, combiners and weighting functions. These processing elements are well known in the art. Notwithstanding, a summer can be utilized to add components of output signals 145a and 145b. Combiners can be used to combine the added signal components. Finally, one or more weighing functions can be used to compensate for processing changes occurring within the ADC 100. The digital output signal 130 resulting from the post-processing circuit 125 can represent the digital equivalent of the analog input signal 105.

Figure 2:
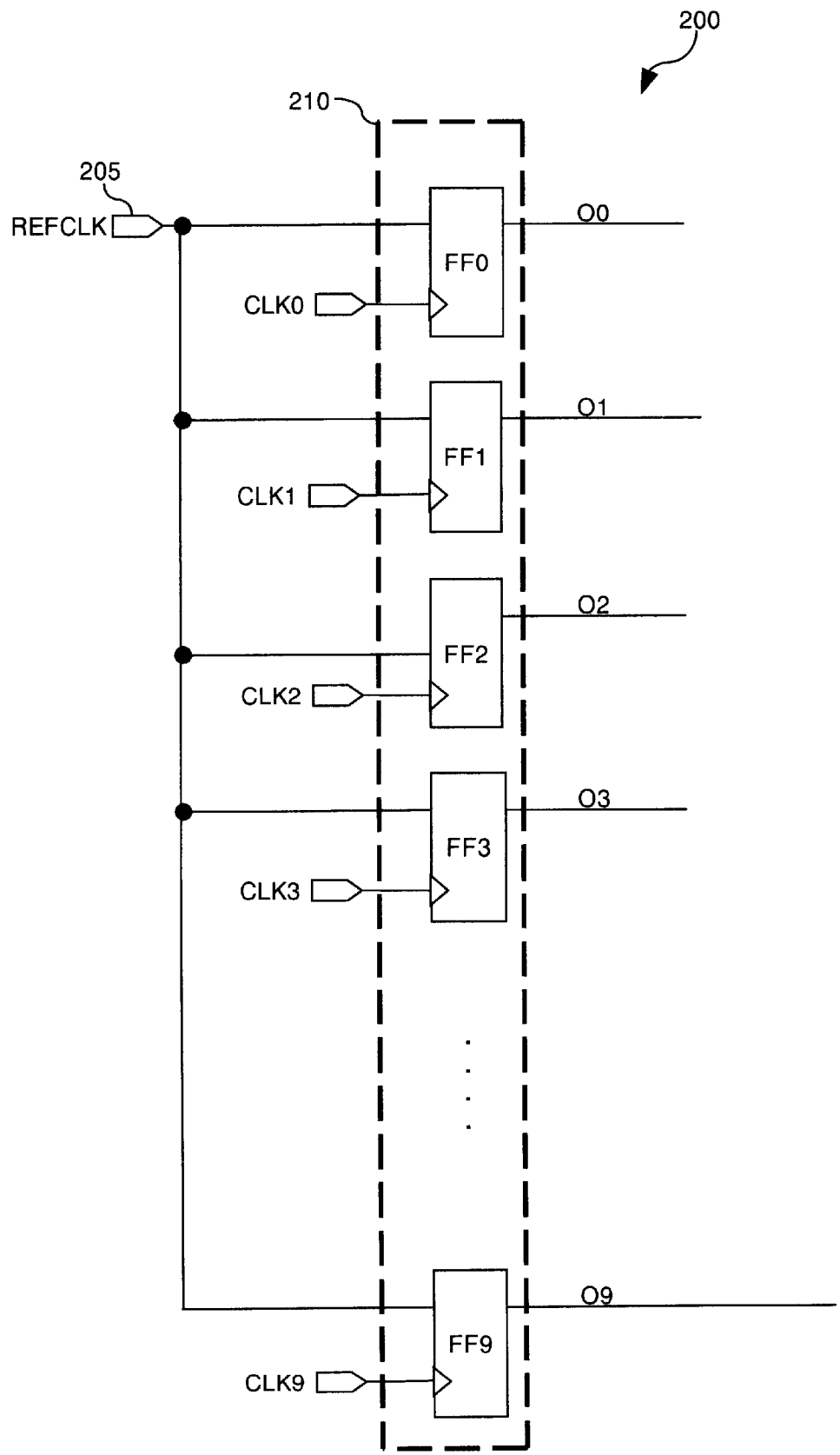
FIG. 2 is a block diagram of an exemplary time detection circuit in accordance with the inventive arrangements if FIG. 1.

FIG. 2 depicts an exemplary time detector circuit 200 in accordance with the inventive arrangements. Referring to FIG. 2, there is shown a bank of flip-flops 210. The bank of flip-flops 210 can include ten (10) flip-flops, namely FF0, FF1, FF2, FF3, . . . , FF9. A REFCLK signal 205 can be connected to a data input of the each of the flip-flops in the bank of flip-flops 210. Input or VCO clock signals CLK0, CLK1, CLK2, CLK3, . . . , CLK9 can be connected to the clock input of flip-flops, namely FF0, FF1, FF2, FF3, . . . , FF9, respectively. The output of the flip-flops FF0, FF1, FF2, FF3, . . . , FF9 are O1, O2, O3, . . . , O9, respectively. Importantly, it should readily be recognized that although ten (10) flip-flops are utilized, the invention is not limited in this regard.

In operation, the time detector 200 can be configured to utilize the input or VCO clocks to sample the REFCLK signal 205. For illustrative purposes, CLK0 can be the reference clock signal for all the VCO clocks. Starting at the rising edge CLK0 ($t_0$), all the clocks CLK0 through CLK9 can sample REFCLK 205 at different times. The outputs of the flip-flops FF0, FF1, . . . , FF9 can represent the sampled values of REFCLK. For example, at a time t1, where $t_1 > t_0$, the outputs of O0 through O9 of FF0 through FF9 can be represented as an output code of 0000111111, respectively. A transition from a logic "0" to a logic "1" can indicate that the rising edge of REFCLK 205 occurs between the VCO clocks that indicate the change. If the VCO clocks have the same frequency as REFCLK 205, then sampling the REF-CLK signal at the next clock signal of the VCO clocks will generate the same output at O0–O9 as the previous sample. In that case, if the sample occurred at a time $t_2$, where $t_2 > t_1$, then O0–O9 can also have the same output code of 0000111111.

In a case where the frequency of REFCLK 205 is less than the VCO clock frequency, then the point where a transition in outputs O0–O9 would occur, would be shifted towards the right in a direction towards O0. For example, at a time $t_2$, where $t_2 > t_1$, then O0–O9 can have an output code of 0011111000. The difference in time between the clock periods can be determined by comparing the output code at time $t_2$ with output code at time $t_1$. This can be achieved by XOR'ing each bit of the second code with its corresponding bit from the first code. Notably, the XOR operation using XOR gates can determine how many bits have changed states between the two periods. Accordingly, since the period of the VCO signal changes while the period of the REFCLK signal remains fixed, the number of logic "1" (ones) at the output of the XOR gates can signify the number of $T_s$'S. For example, if T is the period of CLK0 and $$T_s = \frac{T}{20}$$

represents the shift between clocks comprising a clock set over one period of CLK0, such clock set would contain 20 clock signals although the invention is not limited in this regard.

In operation, the voltage of analog input signal 105 can be converted to a frequency dependent signal 135 by voltage-to-frequency converter 110. For illustrative purposes, the frequency divider 115 can be a divide-by-4 frequency divider. The output signal 135 of the voltage-to-frequency converter 110 can be divided by frequency divider circuit 115. For example, frequency divider 115 can be configured to divide the frequency of signal 135 by four (4). Consequently, the frequency of signal 140 is one-quarter (¼) the frequency of signal 135. Time detector 120a can subsequently determine the frequency of the frequency divided output signal 140 and generate the output signal 145a, which can represent a least significant bits (LSBs) for the output of the ADC 100. The signal 135, which is not frequency divided and which is coupled to the clock input of the time detector 120b, can be used to generate output signal 145b. In this regard, time detector 120b can determine the frequency of signal 135 and generate the output signal 145b, which can represent the MSB.

Figure 3:
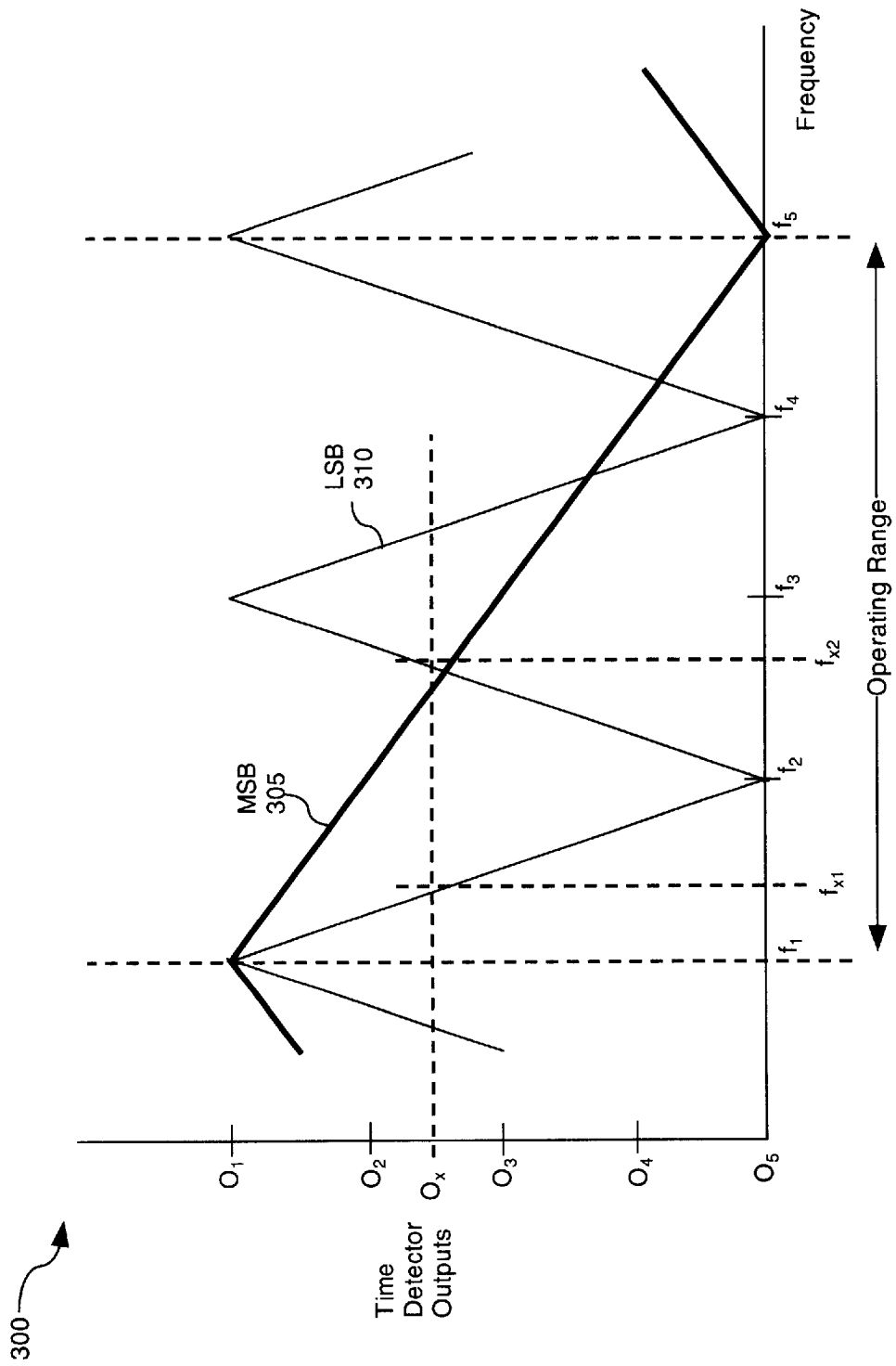
FIG. 3 is an exemplary graph illustrating the relationship between the outputs of the time detectors for the folded analog-to-digital converter of FIG. 1 in accordance with the inventive arrangements.

FIG. 3 is a graph 300 illustrating the relationship between the outputs of the time detectors 120a and 120b for the folded analog-to-digital converter 100 of FIG.1. Referring to FIG. 3, "saw-tooth" curve 310 can represent the output of time detector 120a, which can include the signal processed by the frequency divided path. "Saw-tooth" curves are known in the art. Notably, curve 305 can represent the output of the non-frequency divided path. With regard to the "saw-tooth" curve 310, the output of the time detector 145a can repetitively vary according to the voltage of analog input signal 105. Importantly, since the signal processed by the non-frequency divided path is not frequency divided, then curve 305 contains a less pronounced tooth than the "sawtooth" signal 310.

A single slope of the output 145b of the time detector 120b in the non-frequency divided path can define an operating range for the ADC 100. In this regard, the operating frequency range can be $f_1$, to $f_5$. In general, an output of the time detector can be used to determine a particular frequency range of operation. Referring to curve 305, if the output of the time detector 120b is between $O_1$ and $O_2$, then the frequency necessarily lies between $f_1$ and $f_2$. If the output of the time detector 120b is between $O_2$ and $O_3$, then the frequency necessarily lies between $f_2$ and $f_3$. If the output of the time detector 120b is between $O_3$ and $O_4$ then the frequency necessarily lies between $f_3$ and $f_4$. Finally, if the output of the time detector 120b is between $O_4$ and $O_5$, then the frequency necessarily lies between $f_4$ and $f_5$. Notably, this can provide a "coarse value" for a particular time detector output. The value can be referred to as the "coarse value" since it provides a possible range of frequencies and not a specific frequency. However, curve 310 can be used to determine a "fine value" for a particular time detector output. A "fine value" can be used to represent a particular frequency value. For example, for an output $O_x$, where it is determined that the "coarse value" is between $f_1$ and $f_2$, a "fine value" can be determined from curve 310 to be $f_{x1}$. Similarly, for an output $O_x$, where it is determined that the "coarse value" is between $f_2$ and $f_3$, a "fine value" can be determined from curve 310 to be $f_{x1}$. In general, given a "coarse value," a particular "fine value" can be determined.

Referring to FIG. 1, the use of a divide-by-4 frequency divider can create a four-way folding ADC. Advantageously, an additional two (2) bits of resolution can be gained by utilizing a divide-by-4 frequency divider. Notably, by merely doubling the hardware, an additional two (2) bits of resolution has been gained. In contrast, current ADCs require at least a quadrupling of the hardware to achieve an increased two (2) bit resolution. Importantly, the reduction in hardware can save cost, increase resolution and speed, and decrease power consumption.

Figure 4:
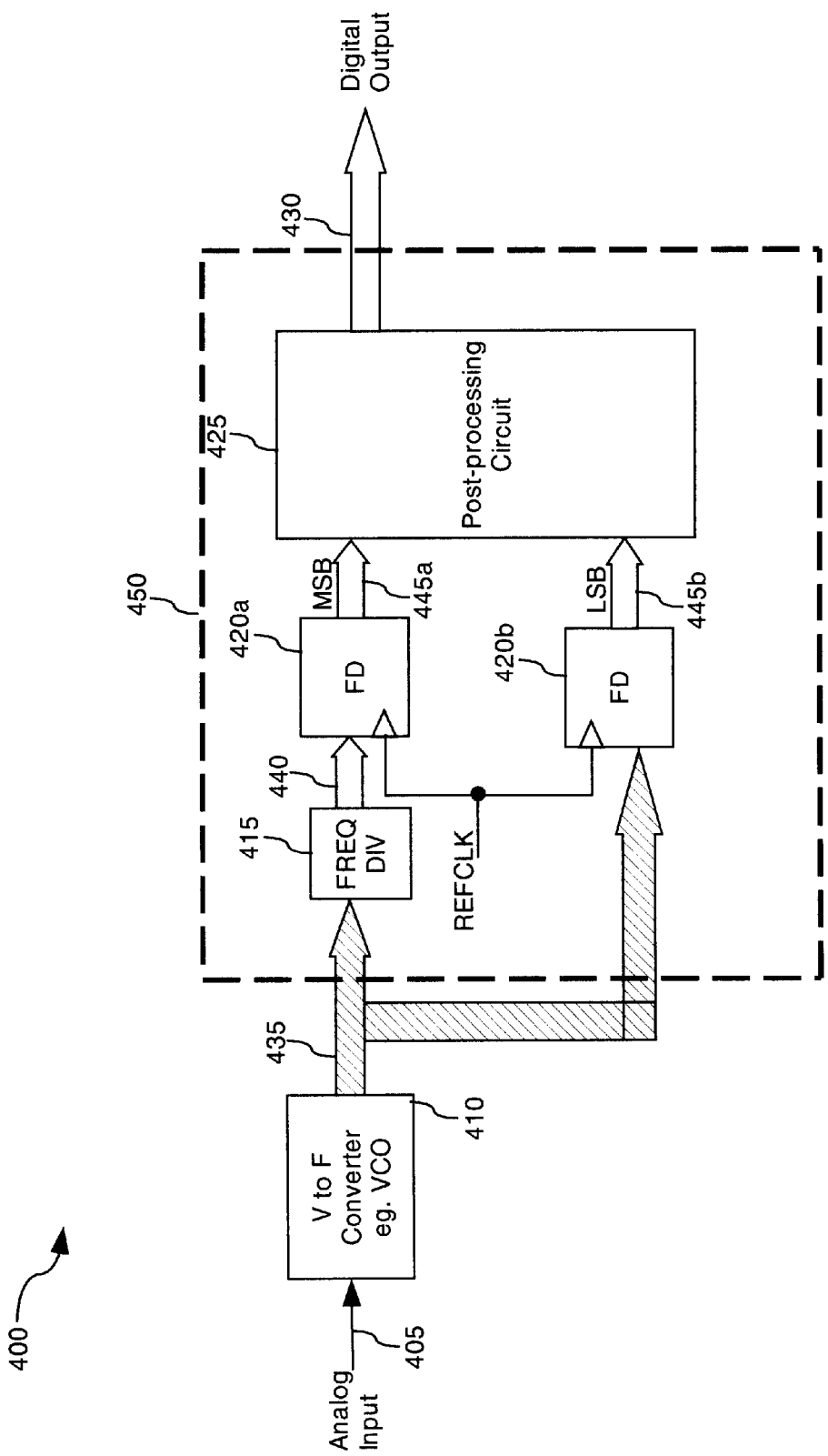
FIG. 4 is a block diagram of an exemplary folded analog-to-digital converter using frequency detectors in accordance with the inventive arrangements.

FIG. 4 is a block diagram of an exemplary folded analog-to-digital converter 400 that can utilize frequency detectors in accordance with the inventive arrangements. Referring to FIG. 4, folded time detector ADC 400 can include a voltage-to-frequency converter circuit 410, a frequency divider circuit 415, a first and a second frequency detector 420a, 420b, and a post-processing circuit 425. Importantly, although the frequency divider 415, frequency detectors 420a, 420b and post-processing circuit 425 are shown as separate components, any combination of these components can be embodied in a digital signal processor (DSP). For example, frequency divider 415, frequency detectors 420a, 420b and post-processing circuit 425 can be embodied in a DSP 450.

The voltage-to-frequency converter 410 can be any circuit that can convert an input such as analog input 405 to a signal whose frequency varies according to the voltage of the input signal. The voltage-to-frequency converter 410 can be similar to the voltage-to-frequency converter 110 of FIG. 1.

The output signal 435 of the voltage-to-frequency converter 410 can be coupled to a frequency divider circuit 415. Frequency divider circuits such as 415 are well known in the art, and can be configured to divide the frequency of an input signal such as 435. The output signal 440 of the frequency divider 415 can be coupled to a data input of frequency detector 420a. In this regard, signal 435 passes through a frequency divided path, which can include the frequency divider 415 and the frequency detector 420a. The output signal 445a of frequency detector 420a can be coupled to post-processing circuit 425. The output signal 445a can be used to represent the most significant bit of the output of the ADC 400.

The output 435 of the voltage-to-frequency converter 410 can further be coupled to a data input of frequency detector 420b. In this regard, signal 435 passes through a non-frequency divided path directly the frequency detector 420b. The clock inputs of frequency detectors 420a and 420b can be coupled to a reference clock signal REFCLK. The output signal 445b of frequency detector 420b can be coupled to post-processing circuit 425. In this regard, the output signal 445b of frequency detector 420b can represent the least significant bit of the output of the ADC 400.

The post-processing circuit 425 can include one or more of a plurality of processing elements including summers, combiners and weighting functions. These processing elements are well known in the art. Notwithstanding, a summer can be utilized to add components of output signals 445a and 445b. Combiners can be used to combine added signal components. Finally, weighing functions can be used to compensate for processing changes occurring within the ADC 400. The digital output signal 430 resulting from the post-processing circuit 425 can represent the digital equivalent of the analog input signal 405.

Figure 5:
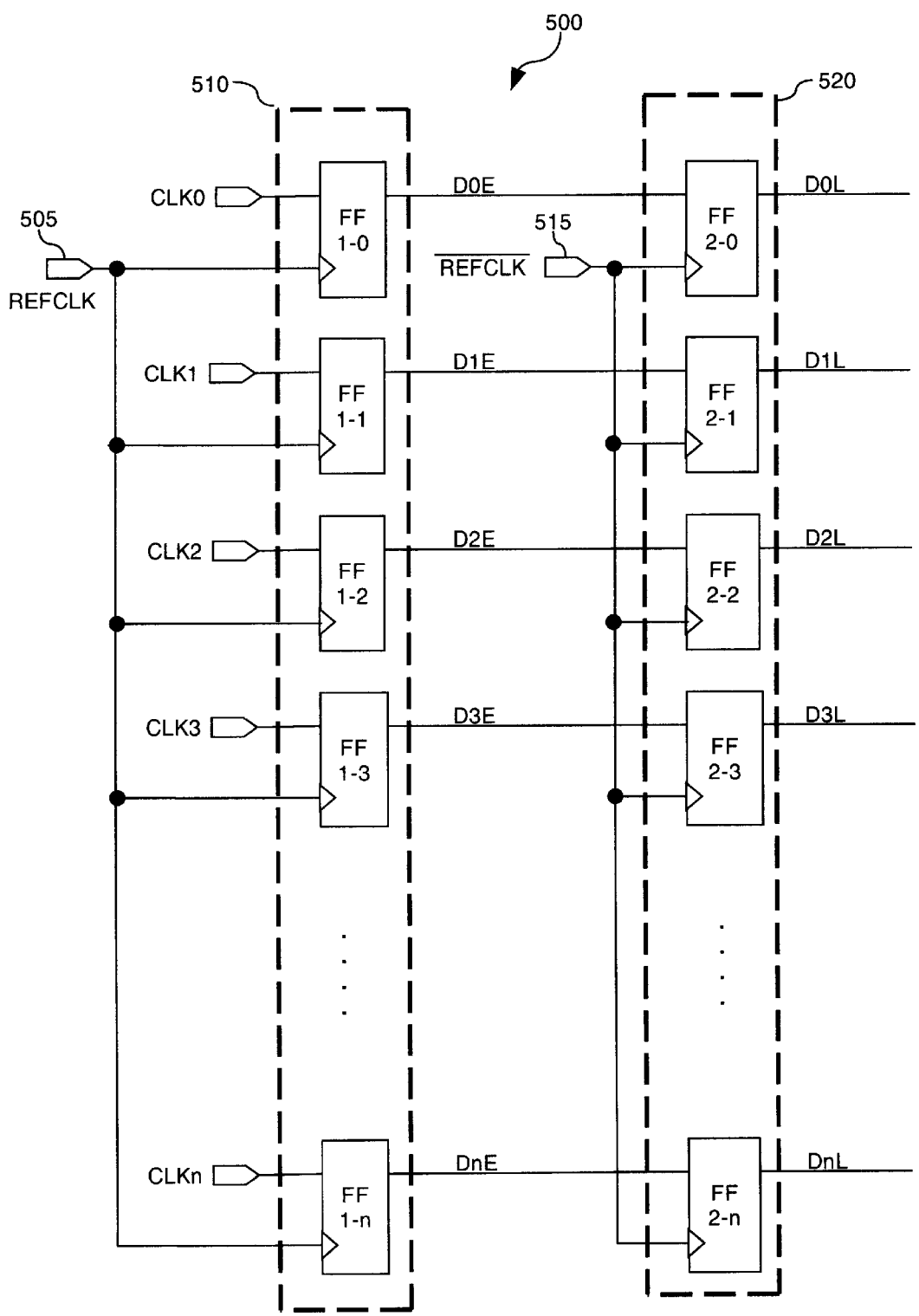
FIG. 5 is a block diagram of an exemplary frequency detection circuit in accordance with the inventive arrangements if FIG. 4.

FIG. 5 depicts an exemplary frequency detector circuit 500 in accordance with folded ADC 400 of FIG. 4. Frequency detector 500 can be configured to measure the frequency of an input signal. Notably, when coupled to the output of voltage-to-frequency divider 415, frequency detector 500 can determine the frequency of one or more frequency divided output signals 440. Referring to FIG. 5, frequency detection circuit 500 can include a first bank of a flip-flops 510 and a second bank of flip-flops 520. Each of the banks of flip-flops 510 and 520 can contain "n+1" flip-flops. For example, "n+1" can be ten (10).

A reference clock signal (REFCLK) 505 can be coupled to a clock input of each of the "n" flip-flops located in the first bank of flip-flops 510. Notably, REFCLK signal 505 can be coupled to flip-flops 1-0, 1-1, 1-2, 1-3, . . . , 1-n. The complement or inverse of REFCLK signal 505, namely input signal 515, can be coupled to an input of each of the "n+1" flip-flops located in the second bank of flip-flops 520. Notably, input signal 515 can be coupled to flip-flops 2-0, 2-1, 2-2, 2-3, . . . , 2-n. The flip-flops can preferably be D-type flip-flops although the invention is not limited in this regard.

Advantageously, a plurality of input clock signals can be used to achieve greater accuracy in determining the variation between an input clock signal and a reference clock signal. Each of the plurality of the input clock signals can have the same frequency and can be a shifted version of the input clock signal. Each input clock signal that is to be compared with the reference clock signal 505 can be singularly coupled to a flip-flop as shown. For example, input or VCO clock signal CLK0 can be coupled to an input of the first flip-flop in the first bank of flip-flops 510, namely flip-flop FF 1-0. Similarly, clock signal CLK1 can be coupled to an input of the second flip-flop in the first bank of flip-flops 510, namely flip-flop FF 1-1. Finally, clock signal CLKn can be coupled to an input of the last flip-flop in the first bank of flip-flops, namely FF 1-n. It should readily be understood that "n" is a placeholder and is a positive whole number which can flexibly represent the number of flip-flops.

The output of each flip-flop in the first bank of flip-flops 110 can be coupled to the input of a corresponding flip-flop in the second bank of flip-flops 520 as shown. For example, the output of flip-flop FF 1-0, DOE, can be coupled to an input of flip-flop FF 2-0 and the output of flip-flop FF 1-1 can be coupled to an input of flip-flop FF 2-1. XOR gates (not shown) can be coupled to the output of corresponding flip-flops to compare a currently sampled value with a previously sampled value of a particular clock signal. For example, a first input of a 2-input XOR gate can be coupled to output DOE of flip-flop FF 1-0 and a second input of the 2-input XOR gate can be coupled to output DOL of flip-flop FF 2-0 to determine changes in the sampled values of CLK0.

Notwithstanding, it should be recognized that FIG. 5 and FIG. 2 are exemplary block diagrams and are not intended to be a limitation on the instant invention. Pending patent application, by the assignee herein, entitled "Method and Circuit for Determining Frequency and Time Variations Between Electronic Signals," and which is filed concurrently herewith, provides a more exhaustive description of various embodiments of frequency detectors and time detectors. This patent application is incorporated herein by reference. Importantly, it should be recognized by one skilled in the art that the present invention is not limited to the embodiments described herein. As such, any frequency detector or time detector can be utilized.

During operation of circuit 400, VCQ 410 can receive as an input, an analog input signal 405. The voltage-to-frequency converter such as VCO 410 can convert input signal 405 to an output signal 435. Output signal 435 can have a frequency that is proportional to the analog input signal 405. Frequency divider circuit 415 can divide the frequency of the output signal 435. The frequency divided output signal 440 can be processed by frequency detector 420a, which produces an output signal 445a. In this regard, the frequency detector 420a can determine the frequency of signal 440. Post-processing circuit 425 can provide summation, combination and weighting functions that can be used to generate a digital output 430 that can be representative of the analog input signal 405.

Figure 6:
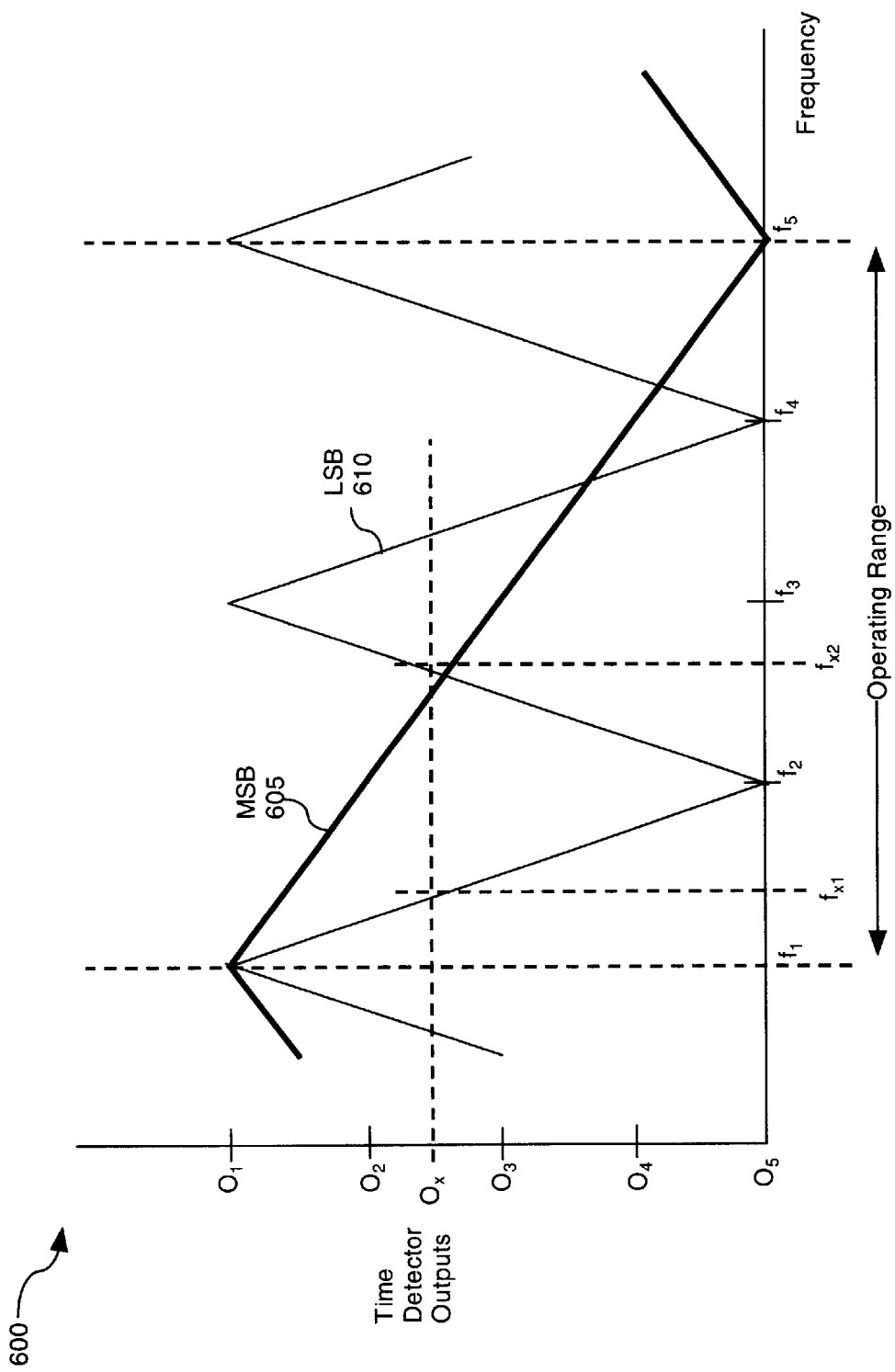
FIG. 6 is an exemplary graph illustrating the relationship between the outputs of the frequency detectors for the folded analog-to-digital converter of FIG. 4 in accordance with the inventive arrangements.

FIG. 6 is a graph 600 illustrating the relationship between the outputs of the frequency detectors 420a and 420b for the folded analog-to-digital converter 400 of FIG. 4. Referring to FIG. 6, "saw-tooth" curve 610 can represent the output of frequency detector 420b, which can include the signal processed by the non-frequency divided path. "Saw-tooth" curves are known in the art. Notably, curve 605 can represent the output of the frequency divided path. With regard to the "saw-tooth" curve 610, the output of the frequency detector 445b can repetitively vary according to the voltage of analog input signal 405. Importantly, since the signal processed by the frequency divided path is frequency divided, then curve 605 can have a less pronounced tooth than the "saw-tooth" signal 610.

A single slope of the output signal 445a of the frequency detector 420a in the frequency divided path can define an operating range for the ADC 400. In this regard, the operating frequency range can be $f_1$ to $f_5$. In general, an output of the frequency detector can be used to determine a particular frequency range of operation. Referring to curve 605, if the output of the frequency detector 420a is between $O_1$ and $O_2$ then the frequency necessarily lies between $f_1$ and $f_2$. If the output of the frequency detector 420a is between $O_2$ and $O_3$, then the frequency necessarily lies between $f_2$ and $f_3$. If the output of the frequency detector 420a is between $O_3$ and $O_4$, then the frequency necessarily lies between $f_3$ and $f_4$. Finally, if the output of the frequency detector 420a is between $O_4$ and $O_5$, then the frequency necessarily lies between $f_4$ and $f_5$. Notably, this can provide a "coarse value" for a particular frequency detector output. The value can be referred to as the "coarse value" since it provides a possible range of frequencies and not a specific frequency. However, curve 610 can be used to determine a "fine value" for a particular frequency detector output. A "fine value" can be used to represent a particular frequency value. For example, for an output $O_x$ where it is determined that the "coarse value" is between $f_1$ and $f_2$, a "fine value" can be determined from curve 610 to be $f_{x1}$. Similarly, for an output $O_x$, where it is determined that the "coarse value" is between $f_2$ and $f_3$, a "fine value" can be determined from curve 310 to be $f_{x2}$. In general, given a "coarse value" and "fine value," the output can be determined.

Referring to FIG. 4, the use of a divide-by-4 frequency divider can create a four-way folding ADC. Advantageously, an additional two (2) bits of resolution can be gained by utilizing a divide-by-4 frequency divider. Notably, by merely doubling the hardware, an additional two (2) bits of resolution has been gained. In contrast, current ADCs require at least a quadrupling of the hardware to achieve an increased two (2) bit resolution. Importantly, the reduction in hardware can save cost, increase resolution and speed, and decrease power consumption.

In light of the foregoing description of the invention, it should be recognized that the present invention can be realized in hardware, software, or a combination of hardware and software. A method and system for folded analog-to-digital converter using time detectors or frequency detectors according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein. In this regard, although the frequency detector 115 and the post-processing circuit 125 are shown as separate entities, their functions can be implemented in a single digital signal processor 150 as shown in FIG. 1.

Figure 7:
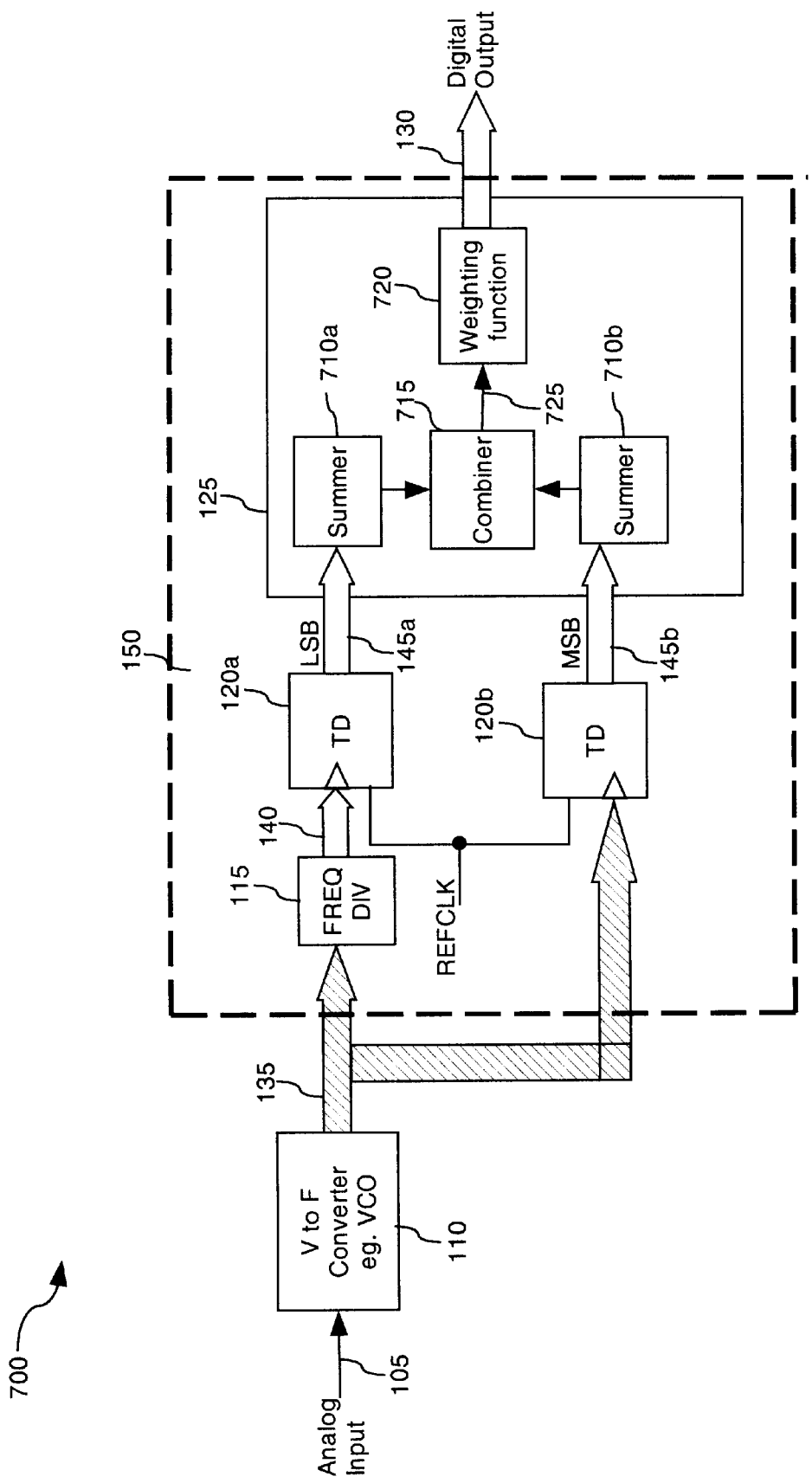
FIG. 7 is a block diagram illustrating the components of an exemplary post-processor with regards to the inventive arrangements of FIG. 1.

FIG. 7 is a block diagram illustrating the components of an exemplary post-processor with regards to the inventive arrangements of FIG. 1. It should be recognized that a similar arrangement of post-processor 125 of FIG. 1 can be utilized for the post processor 425 of the inventive arrangements of FIG. 4. Referring to FIG. 7, post processor 125 can include a first summer 710a, a second summer 710b, and a combiner 715. The weighting function 720 can be optional. Summers and combiners are well known in the art.

Summer 710a can be coupled to the output of time detector 120a. In this regard, the output signal 145a can be an input to the summer 710a. Summer 710b can be coupled to the output of time detector 120b. In this regard, the output signal 145b can be an input to the summer 710b. Combiner 715 can be coupled to the outputs of summer 710a and 710b. The output of combiner 710 can be optionally coupled the weighting function 720. In a case where the weighting function 720 is not utilized, the output 725 of the combiner 715 can be the digital output signal 130, which is representative of the converted analog input signal. In a case where the weighting function 720 is utilized, the output of the weighting function 720 can be the digital output signal 130, which is representative of the converted analog input signal.

In operation, the summer 710*a* can be configured to sum the signal components that comprise signal 145*a*. Similarly, the summer 710*b* can be configured to sum the signal components that comprise signal 145*b*. Combiner 715 can combine the outputs of the summers 710*a*, 710*b* to generate an output signal 725. In case it is necessary to compensate for any changes such as non-linearities that can occur in the ADC 700, weighting function 720 can be configured to weight the output signal 725 from combiner 715. In this regard, the weighted output signal can represent the digital output signal 130. However, in a case where it is not necessary to compensate for any changes, then the output 725 of combiner 715 can represent the digital output 130.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

The embodiments and architecture described above should give a circuit designer greater flexibility in designing ADCs where the variables of operating speed, resolution, power consumption and cost may be an issue. Using the VCO based ADC architecture described herein has the further advantage that it can easily be designed in a digital process.

Additionally, the description above is intended by way of example only and is not intended to limit the present invention in any way, except as set forth in the following claims.

What is claimed is:

1. A method for converting an analog input signal to a digital output signal, the method comprising:
   converting the analog input signal to at least one intermediate signal having a frequency dependent on the analog input signal;
   dividing a frequency of said at least one intermediate signal to generate a frequency divided signal;
   determining said frequency of said at least one intermediate signal and said frequency divided signal; and
   processing said determined frequency of said at least one intermediate signal and said frequency of said frequency divided signal to generate the digital output signal which is representative of the analog input signal.

2. The method according to claim 1, wherein said converting step further comprises converting a voltage of the analog input signal to said intermediate frequency dependent signal.

3. The method according to claim 2, wherein said determining step further comprises a step of determining said frequency of said at least one intermediate signal using a first time detector and determining said frequency of said frequency divided signal using a second time detector.

4. The method according to claim 1, wherein said processing step further comprises:
   summing component signals of said intermediate signal;
   summing component signals of said frequency divided signal; and
   combining said summed components of said intermediate signal and said frequency divided signal to generate a combined signal.

5. The method according to claim 4, wherein said combined signal is the digital output signal which is representative of the analog input signal.

6. The method according to claim 4, further comprising a step of weighting said combined signal to generate the digital output signal which is representative of the analog input signal.

7. An analog-to-digital converter for converting an analog input signal to a digital output signal, the analog-to-digital converter comprising:
   means for converting the analog input signal to at least one intermediate signal having a frequency dependent on the analog input signal;
   means for dividing a frequency of said at least one intermediate signal to generate a frequency divided signal;
   means for determining said frequency of said at least one intermediate signal and said frequency divided signal; and
   means for processing said determined frequency of said at least one intermediate signal and said frequency of said frequency divided signal to generate the digital output signal which is representative of the analog input signal.

8. The analog-to-digital converter according to claim 7, wherein said converting means further comprises means for converting a voltage of the analog input signal to said intermediate frequency dependent signal.

9. The analog-to-digital converter according to claim 8, wherein said determining means further comprises means for determining said frequency of said at least one intermediate signal using a first time detector and means for determining said frequency of said frequency divided signal using a second time detector.

10. The analog-to-digital converter according to claim 7, wherein said processing means further comprises:
    means for summing component signals of said intermediate signal;
    means for summing component signals of said frequency divided signal; and
    means for combining said summed components of said intermediate signal and said frequency divided signal to generate a combined signal.

11. The analog-to-digital converter according to claim 10, wherein said combined signal is the digital output signal which is representative of the analog input signal.

12. The analog-to-digital converter according to claim 10, further comprising means for weighting said combined signal to generate the digital output signal which is representative of the analog input signal.

13. An analog-to-digital converter for converting an analog input signal to a digital output signal, the analog-to-digital converter comprising:
    a voltage-to-frequency converter for converting the analog input signal to at least one intermediate signal having a frequency dependent on the analog input signal;
    a frequency divider for dividing a frequency of said at least one intermediate signal to generate a frequency divided signal;
    a first time detector for determining a frequency of said at least one intermediate signal;
    a second time detector for determining a frequency of said frequency divided signal; and
    a post-processor configured for processing said determined frequency of said at least one intermediate signal and said frequency divided signal to generate the digital output signal which is representative of the analog input signal.

14. The analog-to-digital converter according to claim 13, wherein said post-processor further comprises:
   a first summer for summing component signals of said intermediate signal;
   a second summer for summing component signals of said frequency divided signal; and
   a combiner for combining said summed components of said intermediate signal and said frequency divided signal to generate a combined signal.

15. The analog-to-digital converter according to claim 14, wherein said combined signal is the digital output signal which is representative of the analog input signal.

16. The analog-to-digital converter according to claim 15, wherein said post-processor further comprises a weighting function for weighting said combined signal to generate the digital output signal which is representative of the analog input signal.

17. The analog-to-digital converter according to claim 13, wherein said voltage-to-frequency converter is a voltage controlled oscillator.

* * * * *